United States Patent
Gambino et al.

(10) Patent No.: US 6,610,602 B2
(45) Date of Patent: Aug. 26, 2003

(54) MAGNETIC FIELD SENSOR AND METHOD OF MANUFACTURING SAME USING A SELF-ORGANIZING POLYMER MASK

(75) Inventors: Richard J. Gambino, Stony Brook, NY (US); Miriam Rafailovich, Plainview, NY (US); Shaoming Zhu, Stony Brook, NY (US); Jhon F Londono, Mineola, NY (US); Johnathan Sokolov, Plainview, NY (US)

(73) Assignee: The Research Foundation of State University of New York, Stony Brook, NY (US)

( * ) Notice: Subject to any disclaimer, the term of this patent is extended or adjusted under 35 U.S.C. 154(b) by 0 days.

(21) Appl. No.: 09/927,860

(22) Filed: Aug. 10, 2001

(65) Prior Publication Data

US 2002/0064891 A1 May 30, 2002

Related U.S. Application Data

(62) Division of application No. 09/343,013, filed on Jun. 29, 1999, now abandoned.

(51) Int. Cl.[7] .......................... H01L 21/302; B44C 1/22
(52) U.S. Cl. .......................... 438/689; 438/694; 216/22
(58) Field of Search .................................. 438/689, 694; 216/22

(56) References Cited

U.S. PATENT DOCUMENTS

| | | | |
|---|---|---|---|
| 4,613,398 A | 9/1986 | Chiong et al. | 156/628 |
| 5,422,621 A | 6/1995 | Gambino et al. | 338/32 R |
| 5,476,680 A | 12/1995 | Coffey et al. | 427/130 |
| 5,565,236 A | 10/1996 | Gambino et al. | 427/130 |
| 5,585,198 A | 12/1996 | Maeda et al. | 428/611 |
| 5,948,470 A * | 9/1999 | Harrison et al. | 427/198 |
| 6,016,241 A | 1/2000 | Coffey et al. | |
| 6,055,215 A * | 4/2000 | Katsuragawa | 369/13 |

OTHER PUBLICATIONS

Li et al., "X–Ray Reflectivity of Diblock Copolymer Monolayers at the Air/Water Interface," American Chemical Society, pp 1–8, Langmuir 1995, vol. 11, pp. 4785–4792.
Rodriguez, Principles of Polymer Systems, 1982, McGraw–Hill Book Co.., 2$^{nd}$, p. 285.*
Russell et al., Block Copolymers as Nanoscopic Templates, Macromolecular Sysmposia, (2000), Polymer Science and Industrial Research in the Fast–Changing Age, vol. 159, pp. 77–88).*
Ober et al., Block Copolymers as Lithographic Materials, (1996), Journal of Photopolymer Science and Technology, vol. 9, No. 1, pp. 1–12.*

* cited by examiner

Primary Examiner—Benjamin L. Utech
Assistant Examiner—Lynette T. Umez-Eronini
(74) Attorney, Agent, or Firm—Baker Botts LLP (57) ABSTRACT

A giant magnetoresistance (GMR) sensor is formed using a self organizing diblock copolymer as an etching mask. The diblock copolymer is deposited over a magnetic layer and is self organized into regions of two discrete thicknesses; higher thickness island regions separated by lower thickness valley regions. After the diblock layer is self organized, an etching of process is performed to remove the polymer material from the valley regions as well as the underlying magnetic material. After etching, a patterned magnetic thin film of submicron islands of magnetic material, preferably having a diameter in the single domain range, remain under the mesa region. The islands are interconnected by a non-magnetic, conductive layer with electrical contacts coupled thereto to complete the GMR sensor. When the sensor is not subjected to a magnetic field, the magnetic alignment of the islands is random, and electron scattering results in a high resistance state. When the sensor is magnetically saturated, the magnetic islands have a common magnetic alignment, resulting in reduced sensor resistance.

5 Claims, 8 Drawing Sheets

MAGNETIC FIELD SENSOR AND METHOD OF MANUFACTURING SAME USING A SELF-ORGANIZING POLYMER MASK

This application is a divisional of prior application Ser. No. 09/343,013 filed Jun. 29, 1999 now abandoned.

The present invention was made with the support of a grant from the National Science Foundation, Grant No. NSF-MRSEC (DMR 9632525) and the United States Government may have certain rights in the invention.

FIELD OF THE INVENTION

The present invention relates to magnetic field sensors, and more particularly relates to a thin film magnetic sensor formed using a self-organizing polymer mask to create a patterned magnetic thin film.

BACKGROUND OF THE INVENTION

The magnetoresistance effect has been exploited for use in electronic sensors and equipment, such as in the read/write head of magnetic storage systems. The giant magnetoresistance effect (GMR) is said to be present when a sensor exhibits a change in resistance ($\Delta R/R$) between a magnetically random state and a magnetically saturated state exceeds about 0.5%.

In order to take advantage of the giant magnetoresistance (GMR) effect in the read head of a magnetic storage system, the device must respond to magnetic fields of the order of 100 Oe. The giant magnetoresistance effect has been observed in multilayer devices such as for example, in a publication by S. Parkin et al., Phys. Rev. Lett. 64, 2304 (1990). The giant magnetoresistance effect has also been observed in phase separated, granular Cu—Co films, such as exemplified in a publication by J. Q. Xiao et al., Phys. Rev. Lett. 68, 3749 (1992). In the case of granular films, a polycrystalline metastable Cu—Co alloy film is deposited. With appropriate heat treatment, Co precipitates as single domain particles. Absent the presence of magnetic fields, the magnetization is oriented along the easy axes of each particle, which varies randomly from particle to particle. Thus, in a zero applied magnetic field, the resistance is high because the electrons scatter at each interface where the magnetic orientation changes. At magnetic saturation, the resistance is low to electrons because the magnetization of all of the particles is aligned. However, to reach saturation, the magnetic field must overcome the magnetocrystalline anisotropy and the shape anisotropy of the Co particles. In addition, if there is any interfacial strain at the Cu/Co interface, there may be an additional anisotropy through the magnetostriction ($\lambda$). These factors reduce the sensitivity of the sensor.

U.S. Pat. No. 5,565,236 to Gambino et al. discusses the fabrication of a GMR sensor which includes a granular layer of magnetic particles suspended within a copper matrix. The '236 patent teaches that the granular layer should be textured in order to align the magnetic particles such that there easy axis is aligned along the plane of the layer, which provides a more sensitive magnetic sensor. The process of manufacturing the sensor uses precipitation to generate the submicron magnetic particles. While the sensor of the '236 patent provides high sensitivity, it would be desirable to provide a simpler method of manufacturing a highly sensitive monolithic magnetic field sensor.

SUMMARY OF THE INVENTION

It is an object of the present invention to provide an improved method of manufacturing a magnetic field sensor.

In accordance with the present invention, a method of forming a magnetic field sensor on a substrate includes the steps of forming a layer of magnetic material supported by the substrate, coating the magnetic material with a diblock copolymer film, and self organizing the copolymer film into mesa regions of a first monomer and valley regions of a second monomer. Next, an etching step is used to remove the second monomer from the valley portions and underlying magnetic material while only partially etching the first monomer, thereby forming a patterned magnetic thin film of magnetic islands corresponding to the mesa regions. The magnetic islands are interconnected with a non-magnetic conductive layer and electrical contacts are connected thereto.

Also in accordance with the present invention, a magnetic field sensor includes a substrate and a patterned magnetic thin film having a plurality of magnetic island regions supported by said substrate. The sensor further includes a non-magnetic conductive layer electrically interconnecting the magnetic island regions. First and second electrical contacts are operatively coupled to the conductive layer at first and second locations, respectively, to facilitate connection of the magnetic field sensor to outside devices, circuits, etc.

These and other features, objects and advantages of the present invention will be apparent from reading the following detailed description of preferred embodiments together with the accompanying drawings, and the scope of the invention will be set forth in the appended claims.

BRIEF DESCRIPTION OF THE DRAWINGS

Further objects, features and advantages of the invention will become apparent from the following detailed description taken in conjunction with the accompanying figures showing illustrative embodiments of the invention, in which.

Throughout the figures, the same reference numerals and characters, unless otherwise stated, are used to denote like features, elements, components or portions of the illustrated embodiments. Moreover, while the subject invention will now be described in detail with reference to the figures, it is done so in connection with the illustrative embodiments. It is intended that changes and modifications can be made to the described embodiments without departing from the true scope and spirit of the subject invention as defined by the appended claims.

DETAILED DESCRIPTION OF PREFERRED EMBODIMENTS

The present invention relates to a thin film magnetic field sensor and methods of fabrication of a magnetic field sensor using a self organizing diblock copolymer film as an etching mask over a magnetic layer. A diblock copolymer film is applied to a substrate. After being annealed, the diblock copolymer film self organizes to provide raised mesa regions which are separated from each other by reduced height valley regions. The valley regions and underlying magnetic layer are then removed, such that a patterned magnetic thin film of sub-micron magnetic islands remain. The magnetic islands are interconnected by a conductive layer to form the magnetic field sensor.

Figure 1:
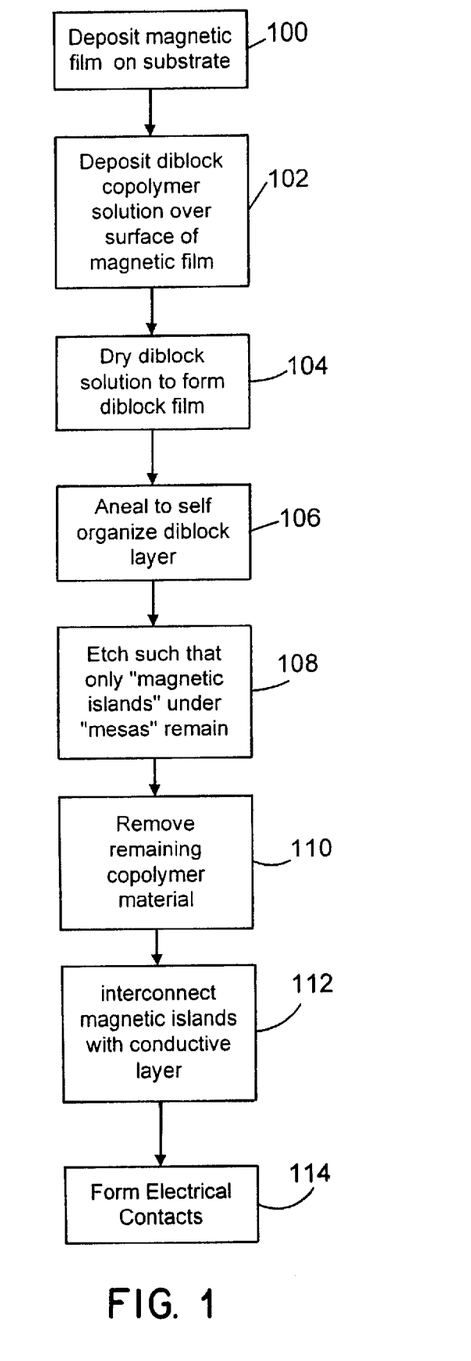
FIG. 1 is a flow chart illustrating a process of forming a magnetic sensor, in accordance with the present invention.
Figure 2A:
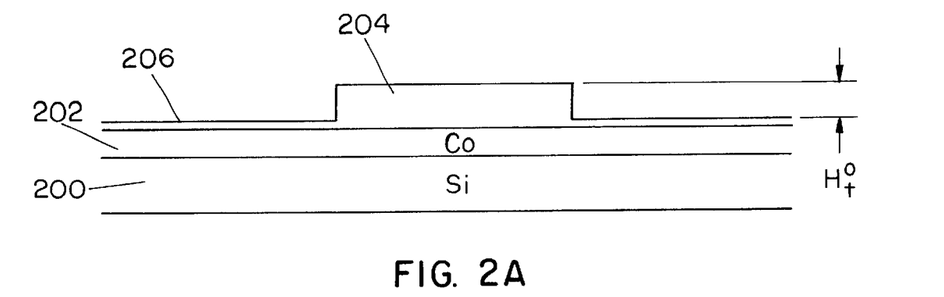
FIGS. 2A through 2C are cross sectional, schematic illustrations depicting various stages of processing of a magnetic sensor in accordance with the present invention, including views of the device before, during and after etching of a self organized polymer mask and underlying magnetic material, respectively.

FIG. 1 is a flow chart illustrating a process of forming a magnetic field sensor in accordance with the present invention. The sensor is formed on a substrate 200, such as single crystal silicon, as illustrated in FIG. 2A. Other suitable substrate materials include ceramic, glass, single crystal germanium and the like. Over the substrate 200, a thin layer of a magnetic material 202, such as cobalt, is formed (step 100). The magnetic material 202 can be formed using ion beam deposition to establish a film of cobalt metal onto the substrate 200 with a thickness of about 300 Å. As an example, a layer of cobalt can be formed on the substrate 200 using a deposition ion source with Argon gas at a flow rate of 12 sccm. The positive Argon ions are accelerated with 1000 Volts, carry a current of 450 ma, −180 Volts and are directed against the substrate at an angle of positive 10 degrees. Of course, other magnetic materials, including magnetic alloys such as Alnico and Permalloy, can be used in place of cobalt. Similarly, methods of establishing the magnetic film other than ion beam deposition may be employed. Preferably, prior to deposition of the magnetic material 202, a protective layer of a non-magnetic material 500 (FIG. 5), such as copper, is formed over the substrate 200. This additional layer 500 prevents particles of the substrate 200 from being sputtered off and deposited on the layer of magnetic material 202 during a subsequent etching operation. The deposit of insulating materials on the magnetic metal is detrimental to the operation of the device.

The layer of magnetic material 202 is covered with a thin film of a diblock copolymer material (step 102). Diblock copolymers are well known in the art of polymer science. Such compositions are generally characterized by at least one block chain of a first monomer material which is linked to at least one block chain of a second monomer material. A suitable diblock copolymer for use in practicing a method in accordance with the present invention is a monodispersed diblock copolymer having a first monomer chain of polystyrene with 46,900 monomer units and a second monomer chain of poly(methyl methacrylate) with 39,600 monomer units and exhibits a molecular weight/molecular number ration of 1.08 (Pst(46,900)-b-PMMA (39,600)),(hereinafter "PS/PMMA"). Such a diblock copolymer is available from Polymer Source, Inc., of Quebec, Canada, as Sample No. P189SMMA. The diblock copolymer is dissolved in a solvent, such as toluene, to form a solution. While diblock copolymers are preferred, it is expected that similar results can be achieved with other block copolymers which tend to exhibit phase separation. While the limits on the minimum length of the polymer chains has not been fully explored, it is expected that a minimum chain length of about $1 \times 10^4$ is required to achieve the subsequently described organization of the polymer into mesa regions and valley regions.

Preferably, the polymer solution is applied to the layer of magnetic material 202, and is then spin cast and dried to form a substantially uniform copolymer thin film (step 104).

After the diblock copolymer film is formed, the film is annealed to effect phase separation between the two monomer chains which form the diblock copolymer. During annealing, the diblock copolymer self-organizes, with one block of the monomers forming mesas 204 which are separated by valley regions 206 formed by the other block of monomers of the diblock copolymer (step 106). In other words, like monomers within a block form aggregates. While heating is the preferred method to effect self organization, any process found to effect phase separation and self-organization can be used in the practice of the present invention. For example, a method of self organization has been described wherein a polymer solution is floated on water to allow the polymer to self organize and the resulting self-organized polymer is lifted off the surface of the water and onto a substrate.

In the case of a diblock film composed of the previously described PS/PMMA, annealing at 180° C. in a vacuum of $10^{-4}$ Torr for two days provides suitable self-organization. As is illustrated in FIG. 2A, self organization results in a height difference, $H_t$, between the mesas 204 and the valley regions 206. The magnitude of this height difference is dependant on several factors, including the selection and interaction of monomers which form the diblock copolymer, the time and temperature of the annealing process used and the extent to which the surface on which the diblock layer is formed exhibits repulsive forces on the monomers used (i.e., degree to which surface and monomers are hydrophilic versus hydrophobic). In the case of a PS/PMMA layer on cobalt, processed as described above, the height difference, $H_t$, is on the order of 30 nm.

Figure 2B:
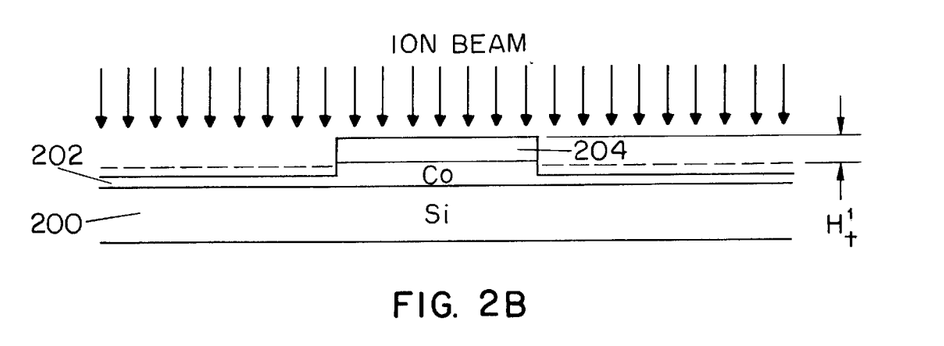

After the diblock copolymer film is self organized, the structure is subjected to an etching process (step 108). Preferably, a broad area ion beam etching process, such as argon beam etching, is used to remove the monomer from the valley regions 206 as well as the magnetic layer 202 which resides under the valley regions 206. This is depicted graphically in FIG. 2B, which illustrates an intermediate time in the etching process where the magnetic material 202 is only partially removed from under the removed valley regions 206. In addition to variations in etch resistance in the materials in the diblock copolymer, because the mesas 204 are thicker than the valley regions 206, the magnetic material 202 under the mesas 204 is protected from etching for a longer duration.

The etching step 108 should be performed for sufficient time to remove the valley regions 206 and underlying layer of magnetic material 202, yet should be completed prior to full removal of the mesas 204. The minimum etch time which is required to accomplish this is dependent on several factors, including the energy level and flux of the ion beam (ion current), the etch resistance of the valley regions 206 and the etch rate of the underlying magnetic material 202. The maximum etch time should be limited such that the mesas 204 are not fully removed and the underlying substrate 200 is not subjected to substantial etching. In the case of ion beam etching, the etch time is referred to as sputtering time. As a general statement, the sputtering time of the mesa regions 204 should be greater than the combined sputtering time of the valley regions 206 and underlying magnetic layer 202. A simplified expression for the sputtering time for each layer can be expressed as:

$$T_{etch} = \text{Thickness}/(\text{sputtering yield} * \text{current density}) \quad (1)$$

Therefore, if the thickness and sputtering yield (i.e., the number of atoms removed per incident ion) are known for each respective layer, the appropriate etch time (sputtering time) can be determined for any given ion beam current density.

From the relationships set forth above, the diblock copolymer is selected to maintain the relationship: $T_{mesa} > T_{valley} + T_{magnetic}$, where $T_{mesa}$ is the etch time of the mesas 204, $T_{valley}$ is the etch time of the valley regions 206 and $T_{magnetic}$ is the etch time of the magnetic layer 202. Therefore, the material forming the mesa regions 204 should be selected to maximize etch resistance, either by virtue of its propensity to form higher profile regions or by selection of materials with a low sputtering yield, which increases the etching time per unit thickness. One way in which the sputtering yield can be reduced is by the inclusion of a side group, such as bromine. The monomer which forms the valley regions 206 should be selected for opposite characteristics, i.e., a high sputtering yield and a propensity for forming a thin layer upon self organization.

Figure 2C:
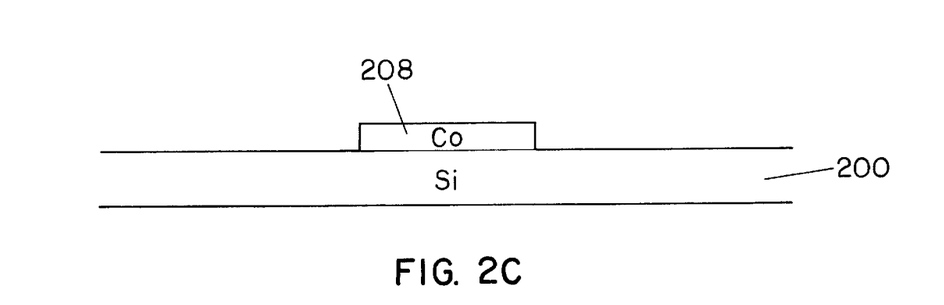
Figure 3:
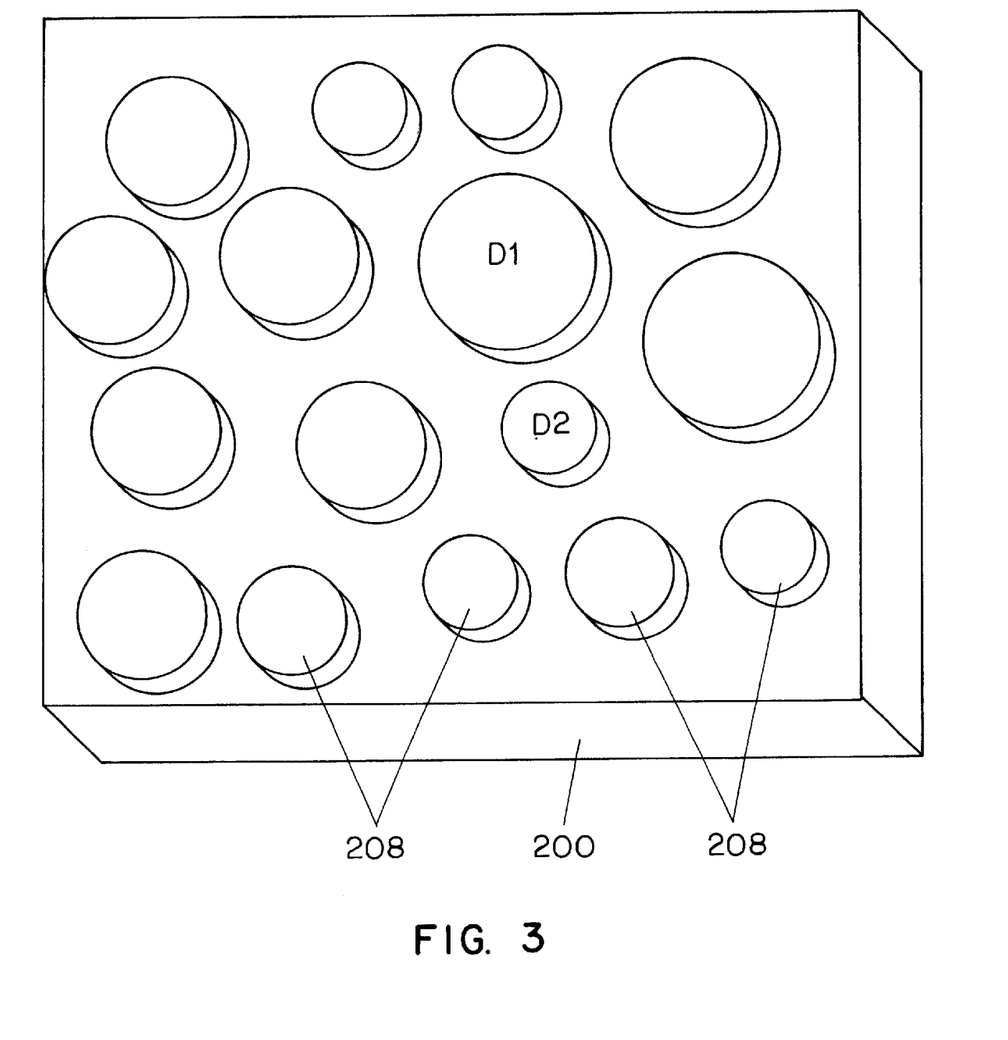
FIG. 3 is perspective view of magnetic islands remaining on a substrate after completion of an etching process.
Figure 4:
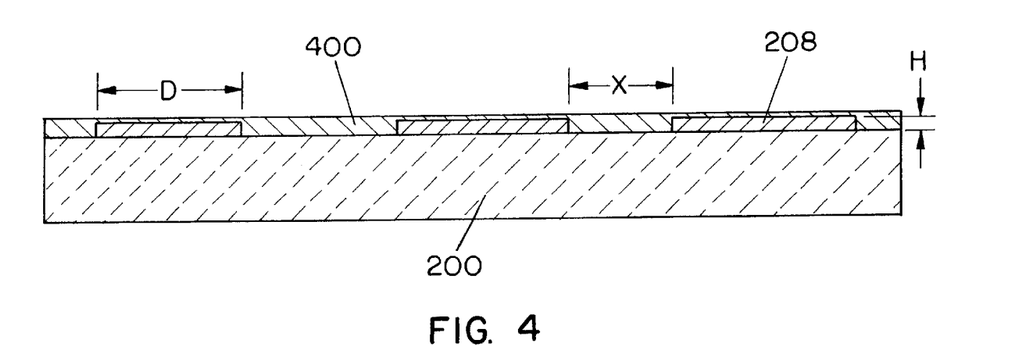
FIG. 4 is a cross sectional, schematic illustration of a magnetic sensor, such as illustrated in FIG. 3, after deposition of a conductive layer interconnecting the magnetic islands.
Figure 5:
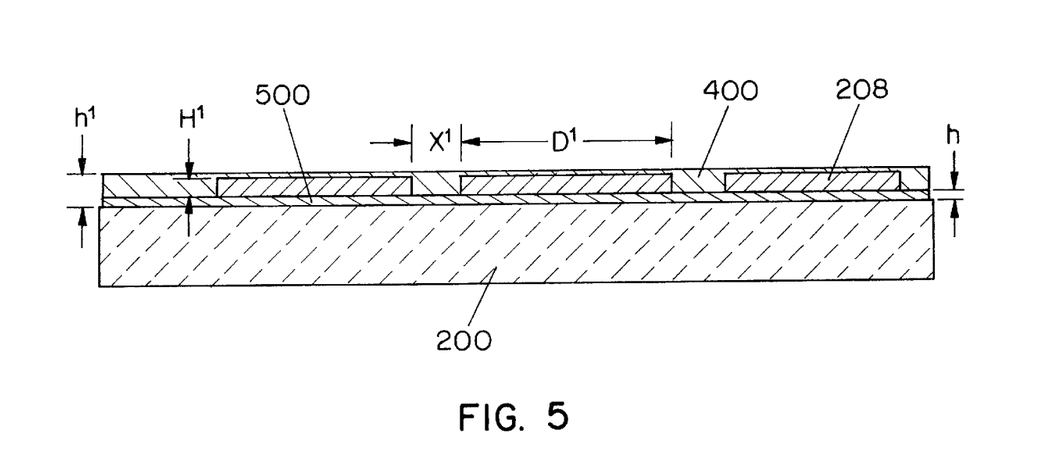
FIG. 5 is a cross sectional, schematic illustration of an alternate embodiment of magnetic sensor, after deposition of a conductive layer about the magnetic islands, also in accordance with the present invention.

Returning to FIG. 1, after the etching step 108 is complete, any remaining polymer film is removed from the surface of the device (step 110). The polymer residue can be removed by washing the surface with a suitable solvent for the polymer, such as toluene. The resulting structure, which includes isolated magnetic islands 208 formed on the substrate 200, is illustrated in FIGS. 2C and 3. To form a magnetic field sensor, the magnetic islands 208 must be electrically interconnected. This can be accomplished by forming a layer of non-magnetic conductive material 400 about the magnetic islands 208 (step 112), which can be performed using ion beam deposition or other known techniques. Preferably, the non-magnetic conductive material is copper which is deposited using an Ion Beam Assisted Deposition process. In this preferred process, a deposition ion source of Argon gas with a flow rate of 12 sccm, and accelerated with 1000 Volts, 450 milliamps, −180 volts is directed against a copper target at an angle of 30 degrees. The deposition ion source is assisted by an assist ion source of neon gas at a flow rate of 15 sccm, and ionized with 175 Volts, 200 ma, −600 volts. The neon ions provide additional energy which assists in forming a copper film of greater density. The resulting sensor is depicted in simplified cross section in FIG. 4. However, if the substrate 200 is initially coated with a protective layer 500 which is conductive and non-magnetic, the layer of non-magnetic conductive material 400 is optional. Alternatively, both layer 500 and conductive material 400 may be employed, as illustrated in FIG. 5.

The thickness of the conductive material 400 should be selected to be less than the mean free path of electrons through the selected material. For copper, this is about 100 Å. When the thickness of the conductive layer 400 is kept below this point, surface scattering dominates the resistance through the sensor because the current path will be significantly effected by the magnetic orientation of the magnetic islands 208. On the other hand, if the thickness of the conductive material 400 significantly exceeds this value, a shunt current path will be created which will reduce the overall resistance, as well as the sensitivity ($\Delta R/R$ ratio) of the magnetic field sensor.

Figure 7:
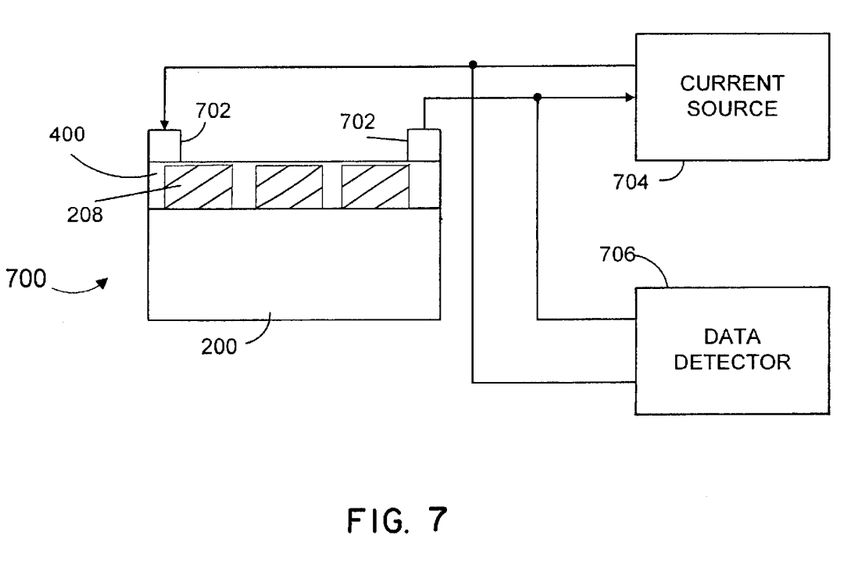
FIG. 7 is a block diagram of a magnetic field sensor, in accordance with the present invention, in cooperation with suitable, exemplary, interface circuitry.

As illustrated in FIG. 7, to electrically interface the magnetic field sensor 700 to other equipment, electrical contacts 702 are electrically coupled to the conductive layer 400 (step 114). By way of the electrical contacts 702, the resistance across the sensor 700 can be determined, such as by coupling a constant current source 704 across the sensor 700 and detecting a change in magnetic field strength using a detector 706 which is responsive to a change in voltage. The sensor 700 generally exhibits a degree of linearity. Therefore, detector 706 can be linear, quasi-linear, or digital in its operation, depending on the desired application. This is merely exemplary and any method for detecting a change of resistance can be used in connection with the sensor of the present invention. In the case of a magnetic storage system, the change in magnetic field strength results from microscopic magnetized (in accordance with the encoded information content) magnetic medium (not shown) which is moved relative to the sensor 700, such as in computer tape drive and disk drive storage systems known in the art.

Figure 6:
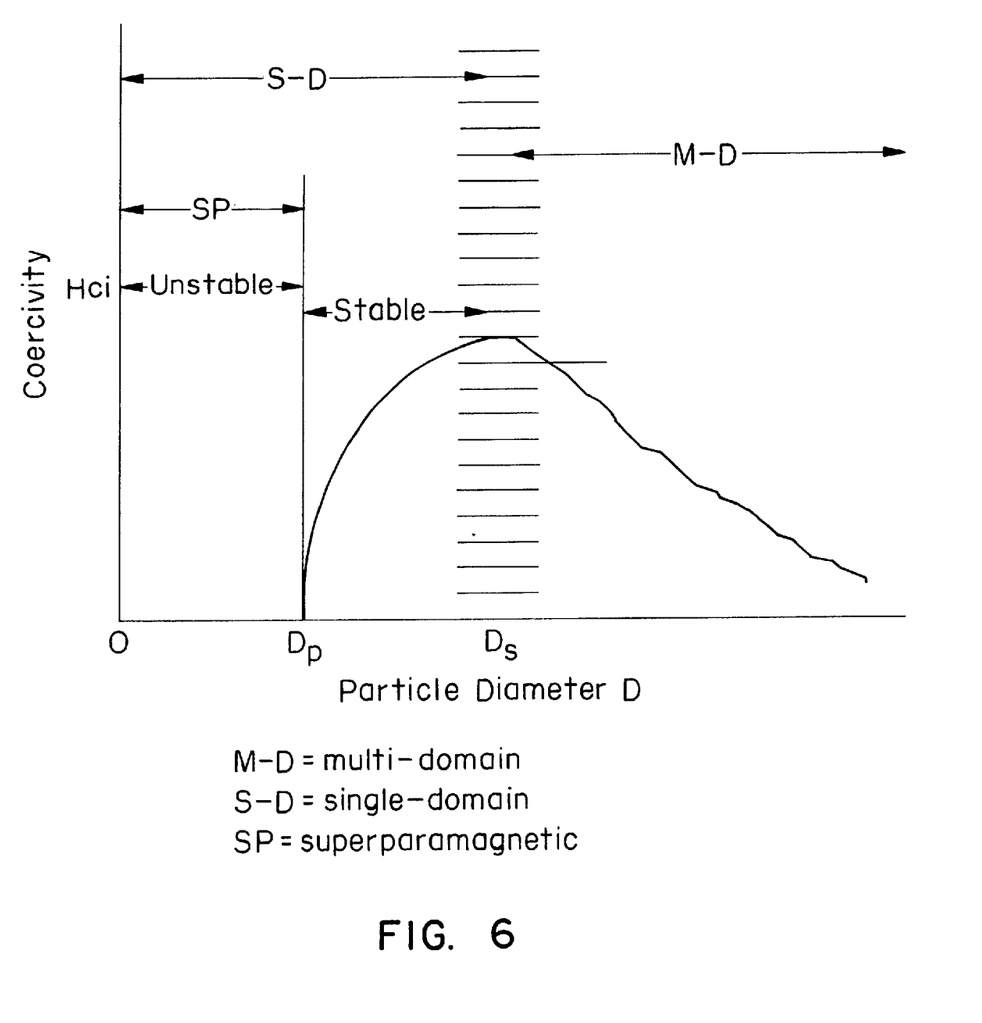
FIG. 6 is a graph of intrinsic coercivity (Hci) versus magnetic island diameter.

The above described process is used to form a layer of sub-micron magnetic islands 208. To create the maximum stable coercivity, the diameter of the magnetic islands 208 should be such that the majority of the magnetic islands 208 have a diameter within the range: $D_p < D < D_s$, where D is the actual island diameter, $D_p$ is the minimum single domain diameter (i.e., below which the islands exhibit superparamagnetic properties), and $D_s$ is the maximum single domain diameter. $D_s$ is defined by the balance of wall energy to magnetic static energy. This is illustrated in the graph of coercivity ($H_{ci}$) versus island diameter in FIG. 6 and was originally presented by Cullity in the text "Introduction to Magnetic Materials," Addison-Wesley Publishing, (1972).

The actual resulting magnetic islands 208 are not uniform in diameter, but are distributed over a range of sizes. Referring to FIG. 3, D1 refers to the largest average island size and D2 refers the smallest average island size. While in actual practice, some percentage of magnetic islands 208 will fall outside such limits, the preferred relationship can be expressed as:

$$D1 \leq Ds;$$

and $$D2 \leq Dp.$$

In the case of spherical particles, the particle sizes $D_p$ and $D_s$ are mathematically well defined for a given material. However, due to the pancake like geometry of the magnetic islands 208 of the present invention, these dimensions deviate from the theoretical model developed for spherical particles. For example, for spherical cobalt particles, $D_s$ is about 300 Å, whereas measured results for 30 nm thick cobalt islands establish that $D_s$ is about 1000–4000 Å. This deviation is likely the result of the pancake like geometry wherein the thickness of the magnetic islands 208 is too small to support a domain wall in the z-direction (i.e., along an axis orthogonal to the surface of the substrate). This larger $D_s$ dimension provides an advantage in that the desired single domain diameter is achieved over a significantly broader range than in the case of spherical particles.

The spacing of the islands (dimension X, FIG. 4) should be selected to be less than the mean free path for spin scattering of the material selected for the conductive layer 400. A spin up conduction electron experiences strong scattering on entering a spin down magnetic region. Thus, if there are equal numbers of spin up and spin down regions, the resistance is high. When the material is magnetized so that all regions are spin up, the scattering, and thus, the resistance, is low. However, if the mean free path for spin scattering is much less than the distance between magnetic regions, the resistance is independent of the magnetic state of the device. In the case where copper is used as the conductive material 400, this dimension, X, is about 1000 Å.

The feature size, i.e., island size and spacing, is largely a function of the selected diblock copolymer. In general, feature size is inversely proportional to the length of the respective chains in the diblock copolymer. Therefore, to reduce the size of the magnetic islands 208, the block chain length of the monomer forming the mesa regions 204 can be reduced. Similarly, to decrease the spacing between the magnetic islands 208, short block chain lengths of the monomer forming the valley regions 206 should be used. The hydrophicity of the surface on which the diblock layer is formed also impacts the size and spacing of the magnetic islands 208. A strongly hydrophilic surface, reacting with a hydrophobic monomer, tends to exhibit repulsive forces which result in a higher profile, and smaller diameter mesas regions 204. To take advantage of this effect, the magnetic layer 202 may be coated with a substance, such as $S_iO_2$, which tends to be strongly hydrophillic.

EXAMPLE 1

An oxidized silicon substrate, commonly used in the electronics industry, was used as a substrate 200. The substrate was cleaned using methods typically used in this industry. The substrate was coated with a 50 Å thick layer of copper to serve as the bottom conductive layer, 500 in FIG. 5. The copper layer was covered with a layer of permalloy ($Ni_{80}Fe_{20}$) 100 Å thick to form the magnetic layer 202. Both of these metal films were deposited by ion beam deposition. The substrate was removed from the ion beam deposition system so that it could be spin coated with a solution of the diblock copolymer, PS/PMMA supplied by Polymer Source, Inc., Montreal, Canada. Toluene is used as a solvent. The initial concentration of the polymer in the solution is about 10%, however the concentration tends not to be a critical parameter because the solvent evaporates as the solution is spun on; the thickness of the polymer coating depends mainly on the spin speed, which in this exemplary case was about 3600 rotations per minute (RPM).

Figure 8:
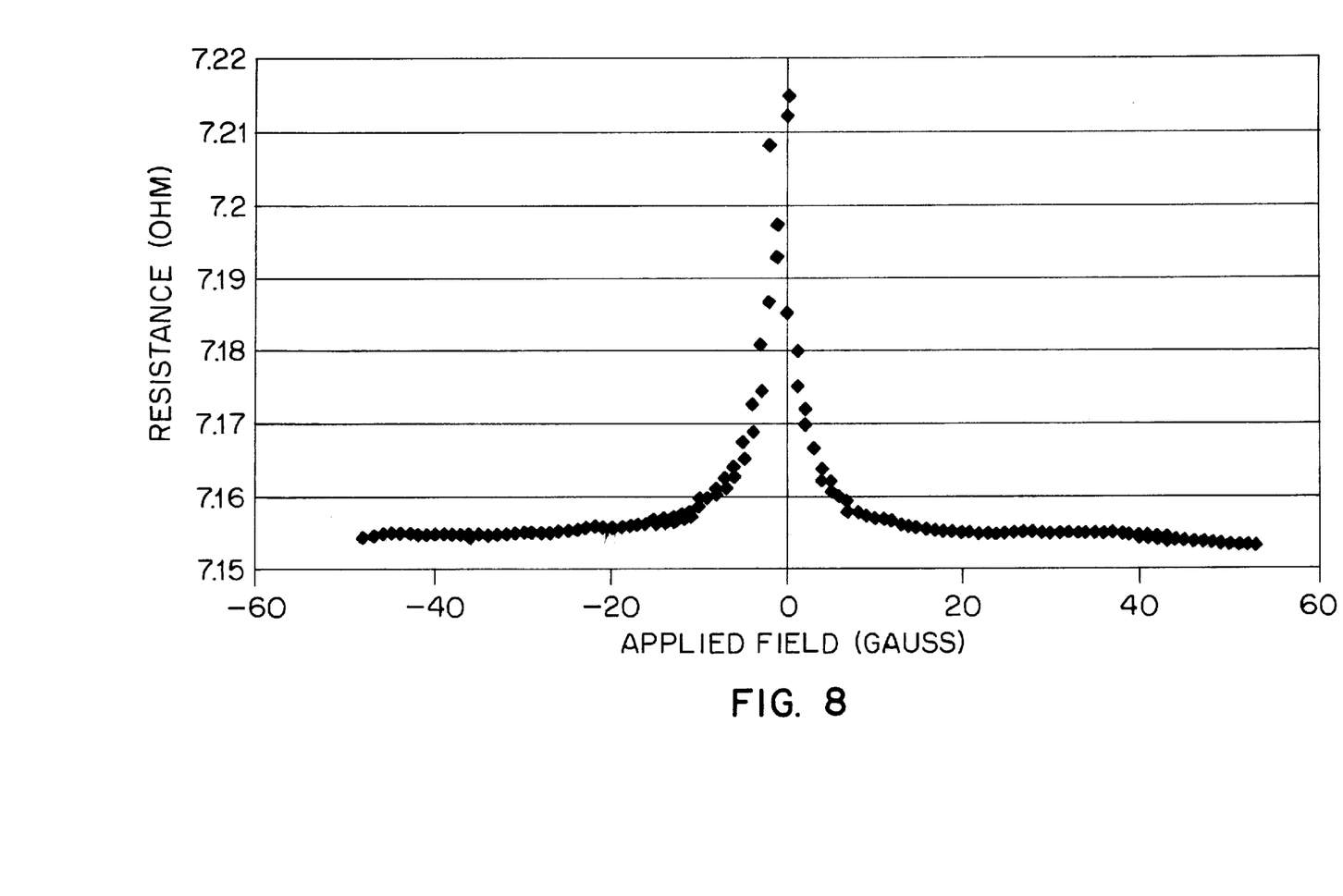
FIG. 8 is a graph of resistance versus applied magnetic field for an exemplary magnetic field sensor in accordance with the present invention.
Figure 9:
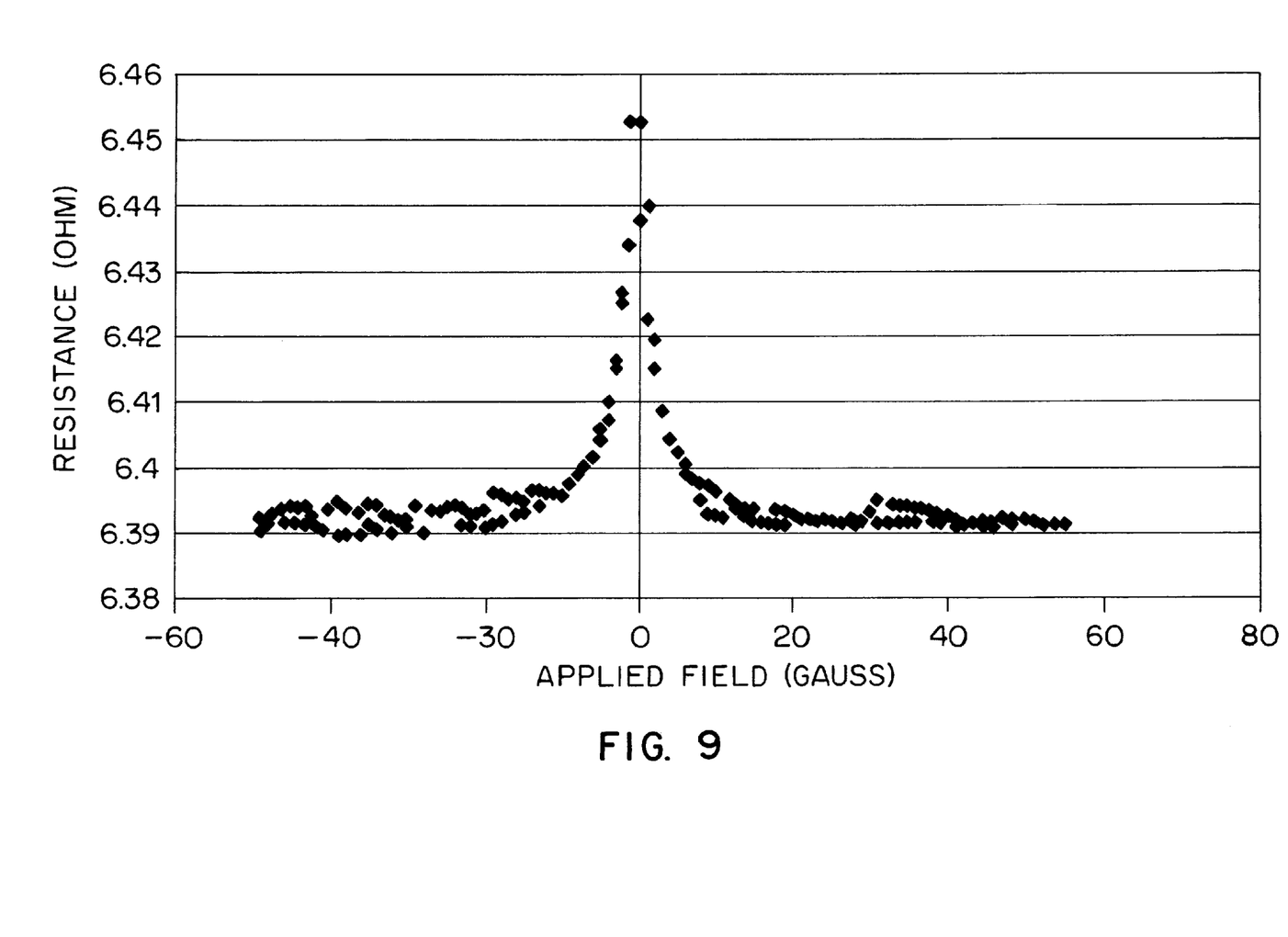
FIG. 9 is a graph of resistance versus applied magnetic field for an exemplary magnetic field sensor in accordance with the present invention.

The coating is annealed by heat treatment in vacuum ($10^{-4}$) at a temperature of 180° C. for two days. After the heat treatment, mesas and valley regions can be observed with an atomic force microscope (AFM). The sample was etched with a broad area ion beam for 120 seconds. The sample was removed from the ion beam vacuum chamber and washed with toluene to remove the remaining polymer residue on the surface so that good electrical contact can be made to the metal films. The exemplary device is about 1 cm by 1 cm and approximately square. Electrical contacts were applied to the four corners of the device. In testing the magnetoresistance two adjacent corners are used to supply current and the other two adjacent corners are used to measure the voltage drop in the device and thus to determine the resistance. The resistance was measured in a magnetic field supplied by an electromagnet driven by a bipolar power supply. The magnetic field was measured with a Hall effect gaussmeter. FIG. 8 shows the resistance as a function of applied magnetic field when the field is applied substantially parallel to the direction of current flow. The resistance of the device in the high resistance state is about 7.215 ohms and the resistance in the low resistance state about 7.155 ohms, resulting in a magnetoresistance $\Delta R/R$ of about 0.86%. Note that most of the change in resistance occurs in a field of less than 5 G giving a field sensitivity in low field of about 0.86/5=0.17%/G. The same device was also measured with the applied magnetic field perpendicular to the current flow direction with similar results, as shown in FIG. 9. The magnetoresistance ÿR/R in this case is 0.95% and the device saturates at a similar low field strength.

EXAMPLE 2

Another device was prepared using the same procedure but the copper layer was only 35 Å thick. All other conditions were the same. In this device the magnetoresistance was 0.12% and the resistance change saturated at about 50 G.

Although the present invention has been described in connection with specific exemplary embodiments, it should be understood that various changes, substitutions and alterations can be made to the disclosed embodiments without departing from the spirit and scope of the invention as set forth in the appended claims.

We claim:

1. A method of forming a magnetic field sensor on a substrate comprising the steps:

forming a layer of magnetic material, supported by the substrate;

coating the magnetic material with a diblock copolymer film;

annealing the copolymer film to form mesa regions of a first monomer and valley regions of a second monomer;

removing the second monomer from the valley regions and underlying magnetic material while only partially etching the first monomer, thereby forming magnetic islands corresponding to the mesa regions; and interconnecting the magnetic islands with a non-magnetic conductive layer.

2. The method of forming a magnetic field sensor as defined by claim 1, wherein said interconnecting step comprises the step of applying a conductive layer over the substrate prior to said forming step.

3. The method of forming a magnetic field sensor as defined by claim 1, wherein the interconnecting step includes the step of depositing a conductive layer over said magnetic islands.

4. The method of forming a magnetic field sensor as defined by claim 1, wherein the coating step comprises:

dissolving a diblock copolymer in a solvent to form a solution;

applying the solution to the magnetic material in a substantially uniform manner; and drying the solution.

5. The method of forming a magnetic field sensor as defined by claim 4, wherein the diblock copolymer includes polystyrene and poly(methyl methacrylate).

* * * * *

UNITED STATES PATENT AND TRADEMARK OFFICE
CERTIFICATE OF CORRECTION

PATENT NO. : 6,610,602 B2
DATED : August 26, 2003
INVENTOR(S) : Richard J. Gambino et al.

It is certified that error appears in the above-identified patent and that said Letters Patent is hereby corrected as shown below:

Title page,
Item [75], Inventors, "Londono" should read -- Londoño --
Item [56], References Cited, OTHER PUBLICATIONS, "Russell et al.," reference, "Sysmposia" should read -- Symposia --

Drawings,
Figure 1, step 106, "Aneal" should read -- Anneal --

Column 2,
Lines 40, 48 and 52, "cross sectional" should read -- cross-sectional --

Column 3,
Line 22, "remain" should read -- remains --
Lines 36 and 37, "Argon" should read -- argon --
Line 39, "Volts" (both occurrences) should read -- volts --; and "ma" should read -- mA --
Line 41, "Alnico" should read -- alnico --; and "Permalloy" should read -- Permalloy$^{TM}$ --

Column 5,
Line 46, "Argon" should read -- argon --
Line 47, "Volts" should read -- volts --
Line 47, "Volts" should read -- volts --
Line 51, "Volts" should read -- volts --; and "ma" should read -- mA --

Column 6,
Line 34, "($H_{ci}$)" should read -- (Hci) --
Line 52, "pancake like" should read -- pancake-like --

Column 7,
Line 20, "hydrophicity" should read -- hydrophobicity --
Line 26, "$S_iO_2$," should read -- $SiO_2$, --
Line 27, "hydrophillic" should read -- hydrophilic --
Line 35, "permalloy" should read -- Permalloy$^{TM}$ --
Lines 58, 59 and 60, "comers" should read -- corners --

UNITED STATES PATENT AND TRADEMARK OFFICE
CERTIFICATE OF CORRECTION

PATENT NO.    : 6,610,602 B2
DATED         : August 26, 2003
INVENTOR(S)   : Richard J. Gambino et al.

It is certified that error appears in the above-identified patent and that said Letters Patent is hereby corrected as shown below:

<u>Column 8,</u>
Line 13, "ÿR/59R" should read -- $\Delta R/R$ --

Signed and Sealed this

Twenty-third Day of March, 2004

JON W. DUDAS
*Acting Director of the United States Patent and Trademark Office*